United States Patent
Bojarczuk, Jr. et al.

(10) Patent No.: US 7,923,743 B2
(45) Date of Patent: *Apr. 12, 2011

(54) SEMICONDUCTOR STRUCTURE INCLUDING MIXED RARE EARTH OXIDE FORMED ON SILICON

(75) Inventors: Nestor Alexander Bojarczuk, Jr., Poughkeepsie, NY (US); Douglas Andrew Buchanan, Cortlandt Manor, NY (US); Supratik Guha, Chappaqua, NY (US); Vijay Narayanan, New York, NY (US); Lars-Ake Ragnarsson, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/620,629

(22) Filed: Nov. 18, 2009

(65) Prior Publication Data

US 2010/0065815 A1 Mar. 18, 2010

Related U.S. Application Data

(62) Division of application No. 12/197,079, filed on Aug. 22, 2008, now Pat. No. 7,648,864, which is a division of application No. 10/998,840, filed on Nov. 30, 2004, now Pat. No. 7,432,550, which is a division of application No. 09/898,039, filed on Jul. 5, 2001, now Pat. No. 6,852,575.

(51) Int. Cl.
*H01L 29/06* (2006.01)
*H01L 33/00* (2006.01)
*H01L 27/15* (2006.01)
*H01L 31/12* (2006.01)

(52) U.S. Cl. .................. 257/98; 257/79; 257/88; 257/9
(58) Field of Classification Search ................ 257/9, 15, 257/324, 79, 98, 184, 635, 13, 88, 636
See application file for complete search history.

(56) References Cited

U.S. PATENT DOCUMENTS

| | | | |
|---|---|---|---|
| 3,986,197 A | 10/1976 | Ablassmeier |
| 4,891,329 A | 1/1990 | Reisman et al. |
| 4,980,339 A | 12/1990 | Setsune et al. |
| 5,019,529 A | 5/1991 | Takasaki |
| 5,037,774 A | 8/1991 | Yamawaki |
| 5,248,564 A | 9/1993 | Ramesh |
| 5,478,653 A | 12/1995 | Guenzer |
| 5,600,154 A | 2/1997 | Shimizu et al. |
| 5,643,804 A | 7/1997 | Arai et al. |
| 5,808,319 A | 9/1998 | Gardner et al. |
| 5,828,080 A | 10/1998 | Yano et al. |
| 5,830,270 A | 11/1998 | McKee et al. |
| 5,847,419 A | 12/1998 | Imai et al. |
| 5,930,612 A | 7/1999 | Ito |

(Continued)

OTHER PUBLICATIONS

"Crystalline Oxides on Silicon: The First Five Monolayers", Rodney A. McKee, et al., Physical Review Letters, vol. 81, No. 14, Oct. 5, 1998, pp. 3014-3017.

(Continued)

*Primary Examiner* — Chuong A. Luu
(74) *Attorney, Agent, or Firm* — Vazken Alexanian; McGinn IP Law Group, PLLC

(57) ABSTRACT

A method (and resultant structure) of forming a semiconductor structure, includes forming a mixed rare earth oxide on silicon. The mixed rare earth oxide is lattice-matched to silicon.

7 Claims, 1 Drawing Sheet

U.S. PATENT DOCUMENTS

| | | |
|---|---|---|
| 6,045,626 A | 4/2000 | Yano et al. |
| 6,096,434 A | 8/2000 | Yano et al. |
| 6,235,563 B1 | 5/2001 | Oka et al. |
| 6,242,298 B1 | 6/2001 | Kawakubo |
| 6,248,621 B1 | 6/2001 | Wilk et al. |
| 6,258,459 B1 | 7/2001 | Noguchi et al. |
| 6,281,559 B1 | 8/2001 | Yu et al. |
| 6,348,373 B1 | 2/2002 | Ma et al. |
| 6,376,337 B1 | 4/2002 | Wang et al. |
| 6,404,027 B1 | 6/2002 | Hong et al. |
| 6,407,435 B1 | 6/2002 | Ma et al. |
| 6,528,377 B1 | 3/2003 | Mihopoulos et al. |
| 6,569,240 B1 | 5/2003 | Nishikawa et al. |
| 6,610,548 B1 | 8/2003 | Ami et al. |
| 6,696,309 B2 | 2/2004 | Yamanaka et al. |
| 6,709,935 B1 | 3/2004 | Yu |
| 6,756,277 B1 | 6/2004 | Yu |
| 6,768,175 B1 | 7/2004 | Morishita et al. |
| 6,933,566 B2 | 8/2005 | Bojarczuk et al. |
| 7,432,550 B2 * | 10/2008 | Bojarczuk et al. ............ 257/347 |
| 2002/0013011 A1 | 1/2002 | Yamanaka et al. |
| 2002/0195602 A1 | 12/2002 | Klosowiak |
| 2003/0057432 A1 | 3/2003 | Gardner et al. |
| 2005/0166834 A1 | 8/2005 | Atanackovic |
| 2005/0233529 A1 | 10/2005 | Pomarede et al. |

OTHER PUBLICATIONS

"Epitaxial Ceo2 on Silicon Substrates and the Potential of Si/ceo2/si for SOI Structures", A.H. Morshed, et al. Mat. Res. Soc. Symp. V474,339 (1197).

J. Haeni, D.C. Schlom, Materials Research Society 2001 Meeting, Apr. 2001, San Francisco, "LaA 103 Derivative Structures for Alternative Gate Dielectrics".

Sze, S. M. Physics of Semiconductor Devices, $2^{nd}$ Ed. New York: John Wiley & Sons, 1981, p. 29.

* cited by examiner

SEMICONDUCTOR STRUCTURE INCLUDING MIXED RARE EARTH OXIDE FORMED ON SILICON

RELATED APPLICATIONS

The Application is a Divisional Application of U.S. patent application Ser. No. 12/197,079, filed on Aug. 22, 2008 now U.S. Pat. No. 7,648,864, which was a Divisional Application of U.S. patent application Ser. No. 10/998,840, (Now U.S. Pat. No. 7,432,550) filed on Nov. 30, 2004, which was a Divisional Application of U.S. patent application Ser. No. 09/898,039, (Now U.S. Pat. No. 6,852,575) filed on Jul. 5, 2001.

BACKGROUND OF THE INVENTION

1. Field of the Invention

The present invention generally relates to an insulator, and more particularly to a lattice-matched epitaxial insulator structure formed on silicon, and arbitrarily grown, lattice-matched epitaxial insulator-silicon structures grown on top of each other.

2. Description of the Related Art

Prior to the present invention, there has not been any lattice-matched epitaxial insulator structure formed on silicon where the lattice constant of the oxide can be varied arbitrarily so that it is equal to, or an integral multiple of the lattice constant of silicon. However, such lattice-matched epitaxial insulator structures on Si are needed for various reasons.

Firstly, such insulators can be used as gate dielectrics for Si complementary metal oxide semiconductor (CMOS) transistors with the view that an epitaxial structure will be less defective. Such epitaxial structures based on $SrTiO_3$-type Perovskite structures have been grown as described in "Crystalline Oxides on Silicon: The First Five Monolayers", Rodney A. McKee et al., Physical Review Letters, Volume 81, Number 14, Oct. 5, 1998, pp. 3014-3017.

However, these structures have a lattice mismatch that is about 2% off from that of Si. Such structures can also be made with $Y_2O_3$ but the lattice mismatch is about 2.5%.

Secondly, such insulators can be used for fully epitaxial Si/insulator/Si epitaxial structures. There have been no prior reports of successful growth of Si/oxide/Si epitaxial structure with a flat interfacial and surface profile. These structures can be used for a variety of different applications such as, for example, silicon-on-insulator (SOI) structures for transistors, double-gated FET structures, and novel optical devices.

Thus, prior to the invention, gate dielectrics/insulators have been provided that are epitaxial, but not lattice-matched. However, these dielectrics/insulators are still problematic as lattice mismatch induced defects are created in the devices (e.g., CMOS FET) incorporating such structures. These defects act as traps and affect the turn-on of the device (transistor), as well as the stability and mobility of the device.

In addition, prior to the present invention, no Si substrate/ epitaxial oxide/epitaxial silicon structures have been grown that have smooth and uniform surfaces and interfaces. There has been one report (e.g., see "Epitaxial $Ceo_2$ on Silicon Substrates and the Potential of Si/ceo2/si for SOI Structures", A.H. Morshed et al. Mat. Res. Soc. Symp. V474, 339(1197)) of attempting to grow epitaxial Si films on $CeO_2$ (cerium oxide). However, the Si growth profile was rough and three dimensional and the silicon was not completely epitaxial in nature.

Thus, prior to the present invention, there has not been any lattice-matched epitaxial insulator structure formed on silicon which is substantially defect-free, nor has the advantages of such a structure been recognized prior to the present invention.

SUMMARY OF THE INVENTION

In view of the foregoing and other problems, drawbacks, and disadvantages of the conventional methods and structures, an object of the present invention is to provide a lattice-matched epitaxial insulator structure formed on silicon and a method of forming the same.

In a first aspect of the present invention, a method (and resultant structure) of forming a semiconductor structure, includes forming a mixed rare earth oxide on silicon. The mixed rare earth oxide is lattice-matched to silicon.

With the unique and unobvious aspects of the invention, a lattice-matched epitaxial insulator structure is formed on silicon. These structures can be used for a variety of different applications such as, for example, silicon-on-insulator structures for transistors, double-gated FET structures, and novel optical devices.

The inventive compound has a lattice constant which is preferably twice that of silicon, and thus it is a multiple such that everything "fits". The insulator also possessed a high band-gap (75 eV), a high dielectric constant (>10) and a low electrical current leakage. As a result, various band gap engineered thin film heterostructures with silicon may be conceived. Some of these devices have been mentioned above, but are re-emphasized below.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
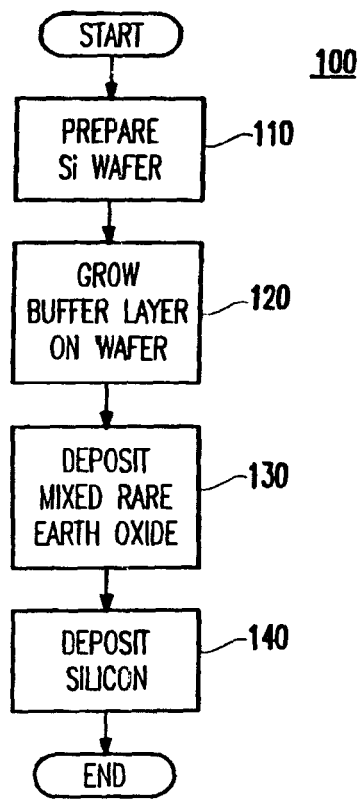
FIG. 1 illustrates a flowchart of the method 100 according to the present invention.
Figure 2A:
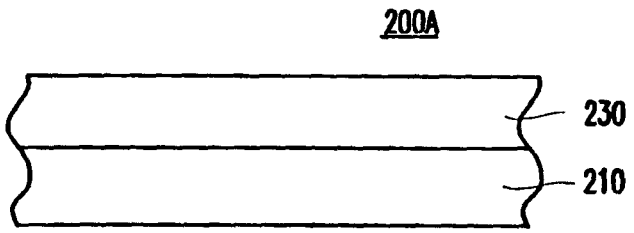
FIG. 2A illustrates a structure 200A of the invention in its most basic form.
Figure 2B:
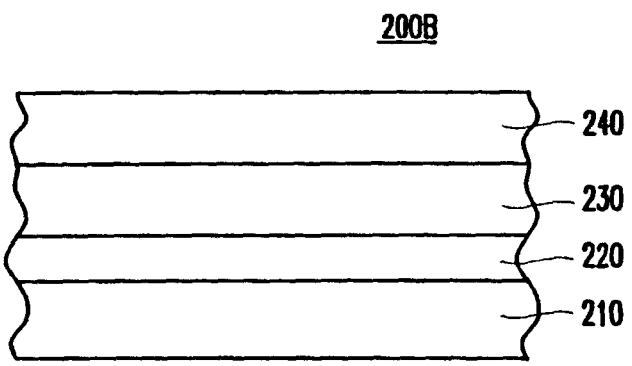
FIG. 2B illustrates a structure 200B formed by the method 100 of the present invention.
Figure 3:
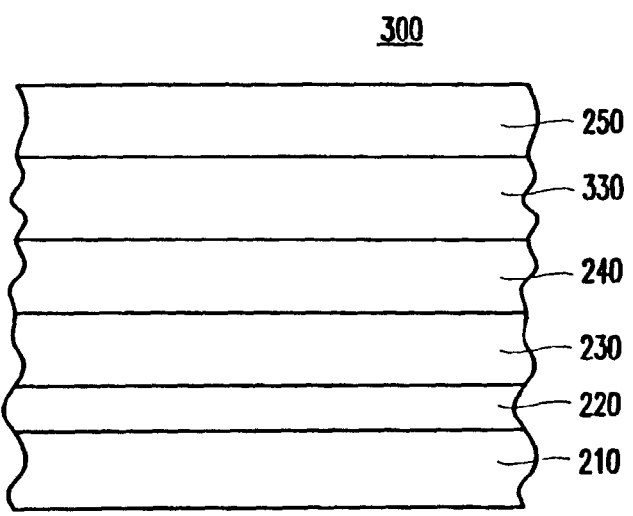
FIG. 3 illustrates another structure 300 of the method of the present invention including a multi-layer stack structure.

Referring now to the drawings, and more particularly to FIGS. 1-3, there are shown preferred embodiments of the method and structures 10 according to the present invention.

Prior to turning to the details of the invention, it is noted that the present invention has provided a new material, (La, $Y)_2O_3$ that can be closely matched to the Si lattice for epitaxial growth.

That is, Yttrium oxide is a well-known oxide which has a cubic bixbyite (e.g., "bixbyite" refers to a specific cubic, crystallographic structure) structure with a lattice constant of 1.06 nm, which is about 2.4% smaller than two times the lattice constant of silicon. As a result, when one grows thin films of $Y_2O_3$ on silicon, the deposition has epitaxial characteristics but is not of good quality (e.g., defects are created).

Further, lanthanum oxide ($La_2O_3$) is a well-known oxide which has a larger La to O bond length, since La is a larger atom. However, under normal circumstances $La_2O_3$ crystallizes with a hexagonal structure and cannot be lattice-matched to silicon.

There has been reported a cubic bixbyite $La_2O_3$ phase, and it has a lattice constant of 1.138 nm. However, it is not a stable phase under normal pressure and room temperature.

Thus, these known compounds are problematic. The present invention provides a new compound which overcomes the problems of these and other compounds, as discussed below.

That is, in the present invention, a new, metastable $(La_x(Y_{1-x})_2O_3$ alloy has been created. This alloy, at around x=0.3, will be perfectly lattice-matched to silicon and will crystallize in the cubic structure. That is, in its most basic form, as shown in the structure 200A of FIG. 2A, includes the novel compound 230 grown on a silicon substrate 210, as described in further detail below.

In spite of the tendency for $La_2O_3$ to crystallize hexagonally, the cubic modification occurs due to crystal structure stabilization from the Y-containing oxide and epitaxial stabilization from the Si substrate. At x=0.33, the lattice constant of the alloy will be 1.086 nm (i.e., twice that of silicon). This follows from a linear interpolation between the $La_2O_3$ lattice constant of 1.138 nm, the $Y_2O_3$ lattice constant of 1.06 nm, and using Vegord's law.

The present inventors have demonstrated that by straightforward molecular beam epitaxy (MBE), an epitaxial film of good quality may be grown on silicon by depositing $(La_xY_{1-x})_2O_3$. This shows bright, reconstructed reflection high energy electron diffraction patterns typically observed in good epitaxial growth. X-ray diffraction of such layers also indicate that they are epitaxial, single crystal in nature, and of very high quality. It is noted that the invention does not rely on MBE, but instead can employ other types of growth techniques.

Second Embodiment

Further, to the compound described in the first embodiment, in another aspect of the invention, the present inventors have also discovered that, after growing the epitaxial (La, Y)$_2O_3$ layer on silicon (e.g., described below in further detail and shown in step 140 of FIG. 1), an epitaxial Si layer can be further grown on top of this epitaxial $(La,Y)_2O_3$ layer. Such epitaxial growth can be performed by MBE. This is again clearly observed from in-situ reflection high energy electron diffraction patterns. These patterns indicate that a smooth, reconstructed silicon surface may be obtained. This is the first time a silicon/oxide/silicon structure has been grown epitaxially.

Generally, it has been very difficult to grow silicon on the oxide, as typically it is amorphous and when silicon is grown it tends to become polycrystalline. Thus, the SOI structures of the invention are highly advantageous.

Example

Turning to FIG. 1, the method 100 of the invention will be described hereinbelow.

First, in step 110, a wafer was prepared. That is, a clean Si wafer was taken and dipped in a hydrofluoric acid solution in order to produce a hydrogen-passivated surface. The wafer orientation is preferably <111>, but it can also be <100> or <110>. The wafer may have a thickness within a range of about 1 μm to about 10000, uμ. However, it is noted that any thickness may be used, as the thickness of the wafer is not relevant to the invention. Alternatively, one Si wafer may not be hydrogen passivated and can retain a thin (2 nm or less) silicon dioxide layer on its surface.

Then, the wafer was loaded into a vacuum deposition system and heated to about 600° C. in order to desorb the H from the surface and clean it up. It is also possible to heat the wafer to 1000° C. to clean it further, but such a step is not critical.

Following preparation of the Si surface, in step 120, an epitaxial Si buffer was grown on top of the Si wafer resulting in a clean and smooth surface. However, this step is not essential for the process (e.g., the Si buffer layer is optional).

If the silicon buffer layer is grown, then the starting surface should be a clean, oxide-free surface. On the other hand, if the La,Y oxide is to be deposited, then it could be deposited directly on top of the thin (<2 nm) silicon oxide, or on an oxide-free silicon surface. In this example of the present invention, the vacuum chamber for deposition was a standard molecular beam epitaxy chamber. The buffer layer may have a thickness within a range of about 0.5 nm to about 1 micron or more.

In step 130, the $(La,Y)_2O_3$ (or another mixed rare earth oxide as mentioned below) is now ready for deposition. La and Y are heated using standard high temperature commercial effusion cells. Typical La and Y cell operation temperatures are 1300-1700 C. Depending upon the specific cell temperature, the element fluxes can be controlled (as is typical in a standard molecular beam deposition process) and thereby the relative composition of La:Y can be controlled in the deposited film. Oxygen is provided by a molecular oxygen beam. Alternatively, radio frequency (RF) excited atomic oxygen can be provided as well, or in place of molecular oxygen.

With the La and Y cells raised to the appropriate temperature, and an oxygen flow rate of about 1-3 sccm, so that the chamber pressure is in about the 1 E-5 to 1 E-4 range, the epitaxial growth of $(La,Y)_2O_3$ was commenced by opening the La and Y shutters with the substrate facing all three sources (e.g., La, Y, and O). The substrate temperature is typically about 650 C., but can be anywhere in the 400-800 C. range. Epitaxial growth of $(La,Y)_2O_3$ now occurred. Films have been grown with compositions from 0<x<0.5 for the compound $(La_xY_{1-x}.X)_2O_3$. The lattice matching occurs at around x=0.3. Remarkably, single crystal films will grow even through a thin $S_1O_2$ layer is on the Si surface When the Si wafer orientation was (001), the LaY-oxide was grown with its (011) direction normal to the film surface. When the Si wafer orientation was (011), the LaY-oxide was grown with its (111) direction normal. When the Si wafer orientation was (111), the LaY-oxide orientation was normal to the film surface was (111).

Therefore, in the first case, one obtains a two domain epitaxial growth, and in the other two cases, it is possible to get true epitaxial growth.

For epitaxial deposition on Si(111), near-lattice matched LaY-oxides may be grown with a (222) x-ray diffraction full width at half maxima of about 130 arc seconds which indicates the high quality nature of the growth. The inventive compound $(La_xY_{1-x}.X)_2O_3$ may have a thickness within a range of about 0.5 nm to more than 1 micron. Again, the thickness thereof is not relevant to the invention.

Following deposition of the oxide, the vacuum chamber was pumped down to about $10^{-9}$ torr to reduce background oxygen pressures.

Then, in step 140, epitaxial silicon was deposited onto the oxide surface by keeping the substrate at 650-700° C. and evaporating the Si from an electron beam source. The silicon was deposited epitaxially as clearly observed from reflection high energy electron diffraction images. The epitaxial silicon layer may have a thickness within a range of about 0.5 nm to about more than 1 μm. Again, the thickness is not relevant.

Thus, the method 100 is completed, and the completed structure 200B is as shown in FIG. 2B.

That is, in FIG. 2B, silicon wafer 210 has the optional buffer layer 220 formed thereon. Then, the inventive compound $(La_xY_{1-x})_2O_3$ 230 is grown on the buffer layer 220 (or directly on the wafer 210), and a top silicon layer 240 is deposited on the inventive compound $(La_xY_{1-x})_2O_3$ 230. Such a structure would be a silicon-on-insulator structure. It is noted that the invention in its most basic form is the inventive compound 230 formed directly on the silicon wafer 210, as shown in FIG. 2A.

It is noted that the invention can be advantageously used to build multilayer stacks. That is, a stack could be built having a plurality of layers.

For example, FIG. 3 illustrates a structure 300 similar to that of FIG. 2B but in which an additional oxide layer 330 (which can have substantially or identically the same constituents as oxide layer 230, or in which a compound different from that of 230 can be used as described below) has been grown on top of the silicon layer 240, and then an additional silicon layer (not illustrated) would be formed, and so forth. It is noted that the layers of the figures are not necessarily drawn to scale.

In the structure of FIG. 3, a Silicon quantum well (240) is formed, if the thickness of well 240 is less than about 20 nm. This quantum well can be the building block for resonant tunneling and light emitting devices.

Additionally, a resonant tunneling structure could be formed by forming the structure shown in FIG. 3, but by further forming another silicon layer 250 over oxide layer 330. The device would be based upon electrical current tunneling from Si layer 220 to layer 250, via the oxide layers and mediated by the Si quantum well 240.

Other resonant structures may be made by depositing additional oxide and Si layers 250, 340 and 260. If layers 250 and 240 are <20 nm thick, then a dual quantum well tunneling structure is produced and so on.

Thus, the inventors have grown an oxide/silicon multilayer structure that is an epitaxial heterostructure. Such a plurality of interleaved layers/structures can be used for novel devices.

For example, the inventive compound can be used for a gate dielectric for a metal oxide semiconductor field effect transistor (MOSFET) by taking silicon and growing an insulator on it, and then growing an epitaxial silicon layer on the insulator. If this epitaxial Si layer forms the channel of a transistor, then a silicon-on-insulator FET is formed.

Further, as alluded to above, the invention can be used to form a silicon on-insulator-based transistor with a gate dielectric on either side, or the inventive structures can be used for resonant tunneling devices (which are not transistors but are other devices) as briefly described above.

Additionally, the inventive structure could be used for an optical device in that the novel compound/silicon structure may be luminescent.

As an example of a multi-layer stack utilizing the structure of FIG. 3, with the Si layer 240 being less than 20 nm, a Si quantum well can be obtained, or a Si/oxide stack can be repeated, with the individual layer thickness being less than 5 nm, so that a super lattice structure that acts as a luminescent material is obtained.

Further, it is noted that the present invention is not limited to a mixed rare earth oxide of $(La_xY_{1-x})_2O_3$. The present invention also is equally applicable to other rare earth materials which could be fitted into the same philosophy in terms of looking at the lattice constants and matching them so that they could match silicon. Some other candidate materials and oxides which could be used are samarium (e.g., $Sm_xY_{1-x})_2O_3$), cerium $(Ce_xY_{1-0})_2O_3$), Gadolinium $(La_xGd_{1-x})_2O_3$), Gadolinium oxide and Europium oxide (e.g., $(Gd_xEu_{1-x})_2O_3$), etc.

With the unique and unobvious aspects of the invention, new compounds have been developed in which as the yttrium oxide is growing a small amount of lanthanum (or other rare earth material as noted above) is added. The invention would find great benefit in microdevice structuring etc., due to its lattice matching with silicon. While the invention has been described in terms of several preferred embodiments, those skilled in the art will recognize that the invention can be practiced with modification within the spirit and scope of the appended claims.

What is claimed is:

1. An optical device, comprising:
   a first layer of mixed rare earth oxide on a silicon substrate, said mixed rare earth oxide being single crystal and lattice matched to said silicon substrate;
   a first silicon layer formed on said layer of mixed rare earth oxide;
   a second layer of mixed rare earth oxide formed on the first silicon layer; and
   a second silicon layer formed on said second layer of mixed rare earth oxide.

2. The optical device of claim 1, wherein a lattice constant of said mixed rare earth oxide is substantially a multiple of a lattice constant of silicon.

3. A light-emitting device, comprising:
   a first layer of mixed rare earth oxide on a silicon substrate, said mixed rare earth oxide being single crystal and lattice matched to said silicon substrate;
   a quantum well comprising a first silicon layer formed on said layer of mixed rare earth oxide;
   a second layer of mixed rare earth oxide formed on the first silicon layer; and
   a second silicon layer formed on said second layer of mixed rare earth oxide.

4. The light-emitting device of claim 3, wherein said first silicon layer has a thickness of less than 20 nm.

5. The light-emitting device of claim 3, wherein said second silicon layer has a thickness of less than 20 nm.

6. The light-emitting device of claim 3, wherein a lattice constant of said first and second layers of mixed rare earth oxide is substantially a multiple of a lattice constant of said first and second silicon layers.

7. The light-emitting device of claim 3, wherein said first and second layers of mixed rare earth oxide and said first and second silicon layers have a thickness of less than 5 nm, and form a super lattice structure that acts as a luminescent material.

* * * * *